(12) United States Patent
McElvain

(10) Patent No.: US 7,730,438 B2
(45) Date of Patent: Jun. 1, 2010

(54) METHODS AND APPARATUSES FOR DESIGNING MULTIPLEXERS

(75) Inventor: Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 256 days.

(21) Appl. No.: 11/809,613

(22) Filed: May 31, 2007

(65) Prior Publication Data

US 2008/0301608 A1    Dec. 4, 2008

(51) Int. Cl.
*G06F 17/50* (2006.01)
(52) U.S. Cl. .............................. 716/7; 716/2
(58) Field of Classification Search ........................ None
See application file for complete search history.

(56) References Cited

U.S. PATENT DOCUMENTS

| 6,438,735 | B1 | 8/2002 | McElvain et al. |
| 6,449,762 | B1 | 9/2002 | McElvain |
| 6,505,337 | B1 * | 1/2003 | Wittig et al. .................. 716/17 |
| 6,711,729 | B1 * | 3/2004 | McElvain et al. ............. 716/18 |
| 6,973,632 | B1 | 12/2005 | Brahme et al. |
| 7,506,278 | B1 * | 3/2009 | Rjimati et al. ................. 716/3 |

OTHER PUBLICATIONS

M. Alioto et al., "Optimized Design of High Fan-In Multiplexers Using Tri-State Buffers," IEEE Trans. on Circtuis and Systems—I: Fundamental Theory and Applications, vol. 49, No. 10, Oct. 2002, pp. 1500-1505.*

K.-Y. Fang et al., "Modular Decomposition of Combinational Multiple-Valued Circuits," IEEE Trans. on Computers, vol. 37, No. 10, Oct. 1988, pp. 1293-1301.*

PCT International Search Report and Written Opinion, mailing date Oct. 2, 2008, (11 pages).

P. Corsonello, et al., "Design of 3:1 Multiplexer Standard Cell", Electronic Letters, IEE Stevenage, GB, vol. 36, No. 24, Nov. 2000, (1 two-sided page).

Synthesis and Simulation Design Guide, (Cover page, Table of Contents, and pp. 4-84-4-89) Jan. 1, 1900, (13 two-sided pages).

* cited by examiner

*Primary Examiner*—Leigh Marie Garbowski
(74) *Attorney, Agent, or Firm*—Blakely, Sokoloff, Taylor & Zafman LLP

(57) ABSTRACT

Methods and apparatuses for designing multiplexers in one or more integrated circuits are described. One exemplary method includes receiving a representation of a first multiplexer and converting the representation to a partition neutral representation of the first multiplexer and partitioning the partition neutral representation to create a plurality of second multiplexers. Another exemplary method includes decomposing a representation of a first multiplexer into a representation of a plurality of second multiplexers, which are coupled together at a common output without any intervening multiplexers between the second multiplexers and the common output, and partitioning the second multiplexers between portions of at least one integrated circuit.

41 Claims, 7 Drawing Sheets

METHODS AND APPARATUSES FOR DESIGNING MULTIPLEXERS

FIELD OF THE INVENTION

The present inventions relate generally to the field of integrated circuit design, and more particularly to the design of integrated circuits through a machine implemented automated process, such as a synthesis process which begins with the use of a description of the integrated circuit, such as a description in a hardware description language of the circuit.

BACKGROUND OF THE INVENTION

For the design of circuits on the scale of VLSI (Very Large Scale Integration) technology, designers often employ computer aided design techniques. Standard languages, such as Hardware Description Language (HDLs) have been developed to describe circuits to aid in the design and simulation of complex circuits, such as complex digital or analog circuits. Several hardware design languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

When designing circuits using HDL compilers, designers often describe circuit elements in HDL source code and then compile the source code to produce synthesized RTL netlists. The RTL netlists correspond to schematic representations of circuit elements. The circuits containing the synthesized circuit elements are often optimized to improve timing relationships and eliminate unnecessary or redundant elements. Such optimization typically involves substituting different gate types or combining and eliminating gates in the circuit. The optimization may be performed before mapping an RTL description, such as an RTL netlist, to a particular predetermined architecture of an integrated circuit, such as a target architecture of a Field Programmable Gate Array (FPGA). As in known in the art, different vendors of FPGAs often have different architectures in that the circuitry within a particular integrated circuit for implementing a function may be different from one vendor to the next. Examples of vendors of FPGAs which have unique architectures include Xilinx and Altera. Various methods and systems for computer aided design of integrated circuits are described in U.S. Pat. Nos. 6,438,735; 6,449,762, and 6,973,632, all of which are incorporated herein by reference.

Often, it is desirable to implement a design in more than one integrated circuit, such as more than one FPGA integrated circuit. This is often necessary when the design is so complex and large that it cannot be fit into the available resources on a single FPGA. This may also be useful for designers of ASICs (Application Specific Integrated Circuits). A growing number of ASIC designers often prototype and test their design by implementing the design in several FPGAs. The complexity of an ASIC design may be such that multiple FPGAs are required to implement all the functions required by the design. This means that the designers must struggle to partition their design into multiple FPGAs, and several tools and methods exist in the prior art for doing so. An example of a technique for partitioning, through an automatic process is described in U.S. Pat. No. 6,438,735, which also describes other prior art techniques for partitioning a design onto multiple FPGAs. An example of a software tool which performs automatic partitioning at the RT component level is the product Certify from Synplicity, Inc. of Sunnyvale, Calif. An example of a tool that performs automatic partitioning at the technology mapped netlist level is the Auspy Partition System II from Auspy Development Inc.

Even with existing techniques for partitioning, it can be difficult to partition a multiplexer (MUX) which can have a large width and potentially have many inputs, one of which is selected to drive the output of the multiplexer. A multiplexer is a well-known circuit element, and an example of a multiplexer is shown in FIG. 1A. FIG. 1A shows a circuit 10 which includes data drivers 12 and 14 which drive clocked data into the inputs 16 and 18 of the multiplexer 20. It will be appreciated that there may be two or more inputs into the multiplexer 20. For example, there may be 20 inputs, each being driven by a data driver into the multiplexer 20. The multiplexer 20 produces an output value at its output 22, and this output value is determined by the data present on the select lines 24 which cause the multiplexer to select one of the inputs for connection to its output 22.

Partitioning a large multiplexer typically requires creating at least three smaller multiplexers. Two of those smaller multiplexers serve to select one input each from two different groups of inputs (to produce two selected inputs) and those two selected inputs are then selected between by the third multiplexer. FIGS. 1B and 1C show an example of such a partition of a large multiplexer into three smaller multiplexers.

In the case of the design 30 shown in FIG. 1B, a multiplexer has been partitioned into three multiplexers 40, 42 and 44 on two different integrated circuits 32 and 34. The multiplexers on the two different integrated circuits are coupled together by a multi-line bus 64 and by a wire 66. Multiplexers 40 and 44, in effect, select between two different groups of inputs to the original multiplexer to thereby provide two outputs which are selected between by the multiplexer 42. Each of the multiplexers is under control of select logic or select lines which cause the selection of an input to be connected to a corresponding output of the multiplexer in a manner known in the art. The select lines are typically driven by decode logic as is known in the art. As shown in FIG. 1B, logic 50 and 56 provide inputs to the multiplexer 40, while logic 54, through bus 62 (which includes a plurality of lines), provides inputs to the multiplexer 44. The multiplexer 44 also receives another input from bus 61 (which includes a plurality of lines). Logic 50 is coupled to the multiplexer 40 through the bus 60, and logic 56 is coupled to the multiplexer 40 through bus 64. The output of multiplexer 40 is coupled to one of the inputs of the multiplexer 42, and the output of the multiplexer 44 is coupled as the other input of the multiplexer 42 which selects between these two inputs to drive its output through line 22 to drive the logic 52. For each of the multiplexers 40, 42, and 44, each data input and each data output is a bus (which includes a plurality of lines), and the switching by the multiplexers switches between the input buses. It will be appreciated that the example shown in FIG. 1B is one of a variety of ways in which the various logic elements and multiplexers may be arranged or partitioned between two or more integrated circuits. However, in each case, the inputs which drive multiplexer 42 must be grouped together relative to the multiplexer 42 in order to preserve the logic implemented by the partitioned multiplexer. In other words, the inputs which drive multiplexer 42 cannot be used to drive multiplexers 40 or 44, but rather must be used to drive the final multiplexer in a tree of multiplexers in order to maintain the proper logical function of the partitioned multiplexer such that it provides the same logical multiplexing as the original multiplexer. FIG.

1C shows this relationship without the complication of multiple integrated circuits. In particular, inputs 70 and 71 must be partitioned with the multiplexer 44. Hence, for example, the drivers for those inputs 70 and 71 must be partitioned with the multiplexer 44. This tends to complicate partitioning operations.

If logic synthesis is performed on a circuit containing a large multiplexor before partitioning into chips, then the resulting circuit will group drivers of the multiplexor according to the multiplexor decomposition chosen by the logic synthesis system. Many different decompositions are possible: trees of smaller multiplexors, and-or decompositions, and special purpose decompositions using FPGA specific components. If the decomposed multiplexor is partitioned across chips, then excessive interconnect use between partitions may be caused by the chosen decomposition. If on the other hand, the partitioning is done before the multiplexor is decomposed, then all signals connected to the multiplexor must be available in a single chip, which can also cause excessive interconnect between partitions. A partial solution is to slice the multiplexor component into single bit width multiplexors. This partial solution is implemented in Certify. This does not help with partitioning multiplexors with large number of inputs and also creates a difficult partitioning problem with the decoding logic for the multiplexor, which will be shared across the slices. What is needed is a simultaneous solution to multiplexor decomposition and partitioning.

SUMMARY OF THE DESCRIPTION

The present inventions disclose methods and apparatuses for designing an integrated circuit. According to one aspect of the present inventions, an exemplary method for designing an integrated circuit includes receiving a representation of a first multiplexer, converting the representation of the first multiplexer to a partition neutral representation of the first multiplexer, and partitioning the partition neutral representation of the first multiplexer to create a plurality of second multiplexers. In one implementation of an embodiment, the plurality of second multiplexers include a first subset of multiplexers and a second subset of multiplexers, wherein the first set of multiplexers are designed to be placed on a first integrated circuit and the second subset of multiplexers is designed to be placed on a second integrated circuit, and wherein the first subset includes one or more multiplexers and wherein the second subset includes one or more multiplexers. In other implementations, the plurality of second multiplexers includes a first subset of multiplexers and a second subset of multiplexers, wherein the first subset of multiplexers is designed to be placed on a first portion of an integrated circuit and the second subset of multiplexers is designed to be placed on a second portion of the integrated circuit. The representation of the first multiplexer may be in a register transfer level (RTL) form within an RTL netlist and the converting may be performed automatically by a machine without human intervention. In at least certain embodiments, the partition neutral representation may include one or more of (a) a plurality of tristate drivers or (b) a wired OR array or (c) a wired AND array. In at least certain embodiments, the method may further include compiling a description of an integrated circuit in an HDL to create the representation of the first multiplexer and the method may further include replicating decode logic of the first multiplexer in order to provide select lines for the second multiplexers.

According to another aspect of the present inventions, an exemplary method includes receiving a representation of a first multiplexer having an output, decomposing the representation of the first multiplexer into a plurality of representations of second multiplexers, wherein the second multiplexers are coupled together at a common output, which matches the output of the first multiplexer, without any intervening multiplexer between the second multiplexers and the common output, and partitioning the second multiplexers between portions of at least one integrated circuit. In at least certain embodiments, the plurality of representations of second multiplexers is a partition neutral form of the first multiplexer. The partitioning may be among multiple integrated circuits or may be between different portions, such as floorplanned portions, of the same integrated circuit. In at least certain embodiments, the representation of the first multiplexer may be in a register transfer level form within an RTL netlist, and the decomposing may be performed automatically by a machine without human intervention. In at least certain embodiments, the plurality of representations of second multiplexers may be in the form of one or more of (a) a plurality of tristate drivers; (b) a wired OR array; or (c) a wired AND array. While certain embodiments of this invention are described with respect to multiplexers, it can also be applied to any component that admits a partition neutral decomposition. For example, an N-input adder can be represented as an abstract bus of wires which adds the values of its drivers. N-input adders where N is greater than 2 would be decomposed into such a bus before partitioning. After partitioning, if several inputs of the adder are in the same partition, then those inputs are reformed into an M-input RTL adder where M is the number of original adder inputs in that partition. A good approximation of the area for partitioning can be made by distributing the estimated area of the adder to its drivers. The partitioning software would require a slight modification to account for the input count at the destination partition where the final sum will occur as it will have an input count equal to the sum of the output counts of the source partitions. As with partitioning of multiplexers, a simultaneous decomposition and partitioning solution can reduce the wire count significantly.

The present inventions also disclose apparatuses, such as digital processing systems which are capable of designing integrated circuits according to one or more of the embodiments of the present inventions. The present inventions also disclose apparatuses, such as computer readable media or machine readable media which may be used to design integrated circuits according to the methods described herein by causing machines, such as data processing systems, to execute one or more of the methods described herein.

Other features of the present inventions will be apparent from the drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

Methods and apparatuses for designing an integrated circuit or a plurality of integrated circuits are described herein. In the following description, for purposes of explanation, numerous specific details are set forth in order to provide a thorough understanding of the present inventions. It will be evident, however, to one skilled in the art that the present inventions may be practiced without these specific details. In other instances, well-known structures, processes, and devices are shown in block diagram form or are referred to in a summary manner in order to provide an explanation without undue detail.

Figure 2A:
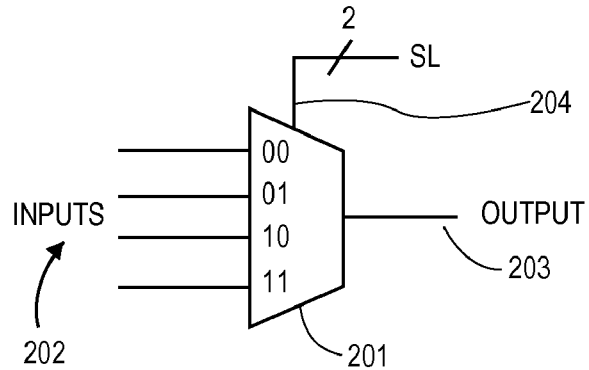
FIG. 2A shows an example of a multiplexer before it is partitioned according to one embodiment of the present inventions.
Figure 2B:
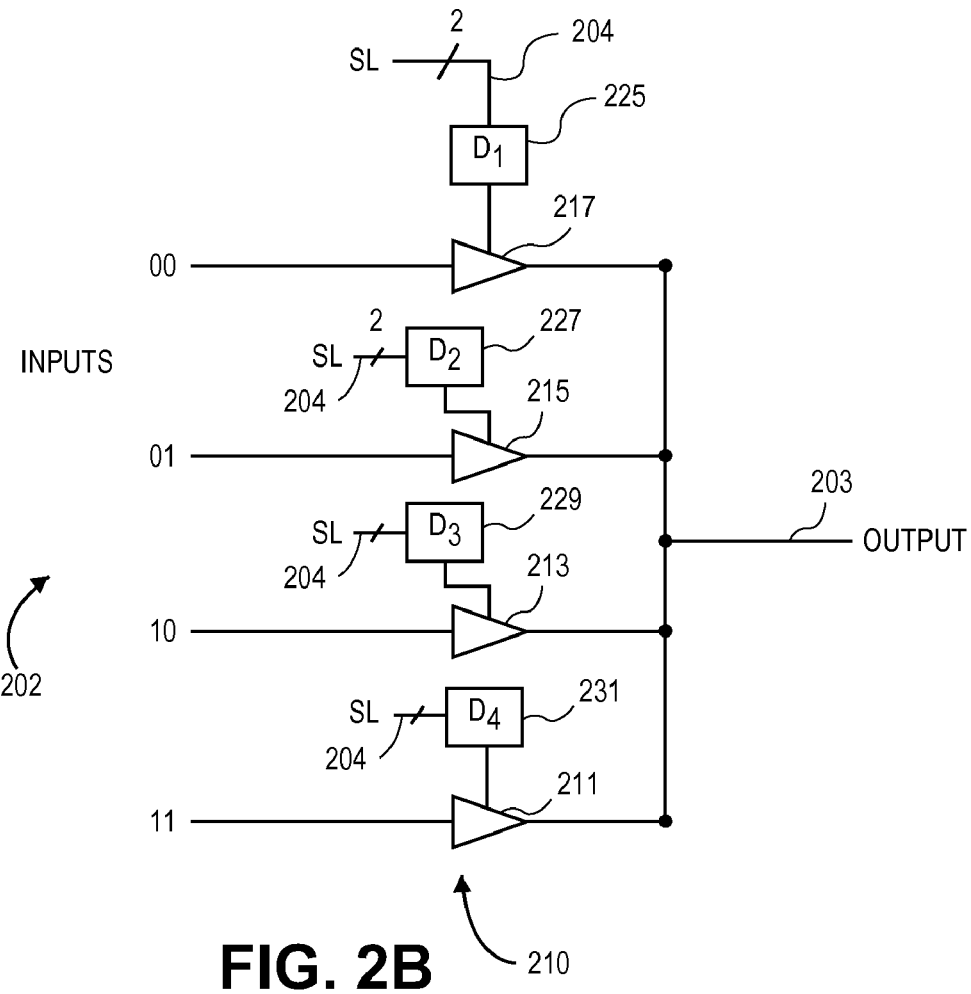
FIG. 2B shows an example of a partition neutral form of a multiplexer according to one embodiment of the present inventions.
Figure 2C:
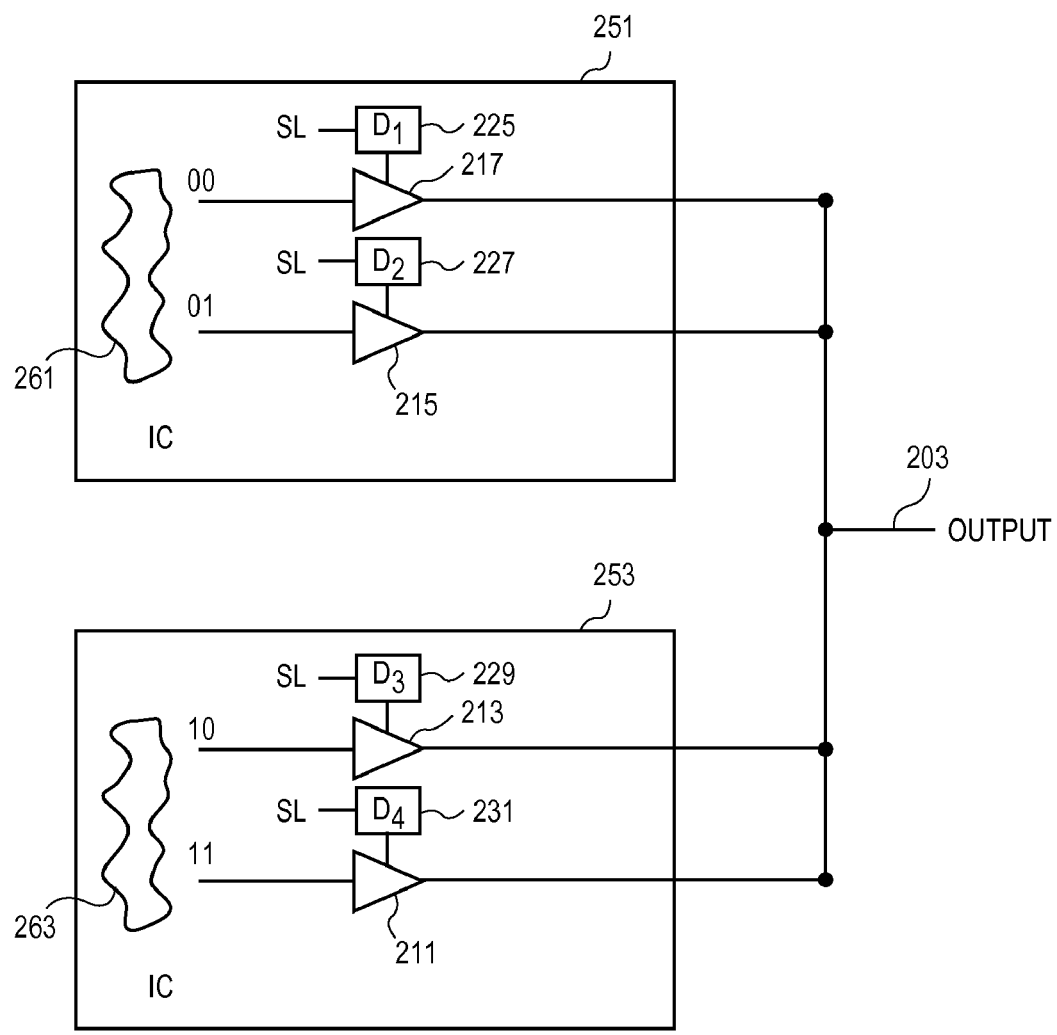
FIG. 2C shows an example of the result of partitioning the partition neutral multiplexer shown in FIG. 2B, where the partition shown in FIG. 2C is across two integrated circuits. In alternative embodiments, the partitioning may be across portions of the same integrated circuit, such as floorplanned portions of the same integrated circuit.

A general example of certain embodiments of the present inventions will now be provided while referring to FIGS. 2A, 2B, and 2C. While many of the embodiments of the present inventions are intended for use in HDL design synthesis software, the inventions are not necessarily limited to such use. Although the use of other languages and computer programs is possible, embodiments of the present inventions will be described in the context of the use of HDL synthesis systems, and particularly those designed for use with integrated circuits which have vendor specific technology/architectures, such as vendor specific architectures of FPGAs. It will be understood, however, that certain embodiments of the present invention may be also employed with other types of integrated circuits, such as ASICs.

FIG. 2A shows a multiplexer 201 which has four inputs 202 and which provides an output 203. In operation, the multiplexer 201 selects one of the four inputs as the input which is used to drive the output 203. The selection of the particular input is under control of the select lines 204 which are typically driven by decode logic as is known in the art. According to at least certain embodiments of the present inventions, the multiplexer 201 may be converted or decomposed from its initial representation as a single multiplexer into a partition neutral representation of that multiplexer in order to provide for a representation which may be partitioned more easily than the original representation of the multiplexer.

FIG. 2B shows an example of a partition neutral representation of the original multiplexer 201. This particular partition neutral representation is formed by coupling the outputs of tristate drivers together at a common output to provide the output 203 of the original multiplexer. Each of the tristate drivers receives one of the original four inputs 202, and each of the tristate drivers includes an enable input which is coupled to corresponding decode logic. Corresponding decode logic is, in turn, coupled to all or a subset of the original select lines 204 which provide the inputs to the decode logic. As shown in FIG. 2B, the tristate driver 217 receives the 00 input and is coupled to the decode logic 225 through the enable input of tristate driver 217. Similarly, the tristate driver 215 receives the input 01 and is coupled to the decode logic 227 through the enable input of tristate driver 215. The tristate driver 213 is coupled to receive the 10 input and is coupled to the decode logic 229 through the enable input of tristate driver 213, and the tristate driver 211 is coupled to the input 11 and is also coupled to the decode logic 231 through the enable input of tristate driver 211. The output of all four of these tristate drivers is coupled together to provide the output 203.

The decode logic for each tristate driver is implemented such that only one of the tristate drivers will drive the output while the others will be set in the high impedance state by their enable inputs which are coupled to their corresponding decode logic. For example, if the select lines specified that the 00 input is to be selected for output through the multiplexer, then the decode logic 225 will cause the tristate driver 217 to be set such that the input of the tristate driver 217 will drive its output and hence the output 203 because all other tristate drivers 215, 213, and 211 will have their enable inputs set such that their outputs are in a high impedance state. For example, the decode logic 227 causes the enable input of the tristate driver 215 to set the output of the tristate driver 215 in its high impedance state. Similarly, decode logic 229 and decode logic 231 cause a similar state for tristate drivers 213 and 211, respectively. This allows the output from tristate driver 217 to drive the output 203.

Figure 1A:
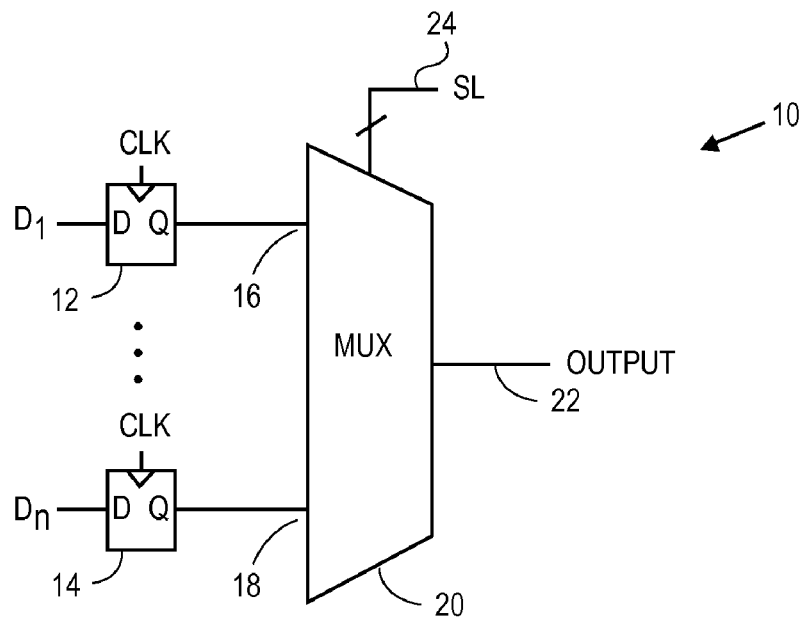
FIG. 1A shows an example of a circuit which includes a multiplexer.
Figure 1B:
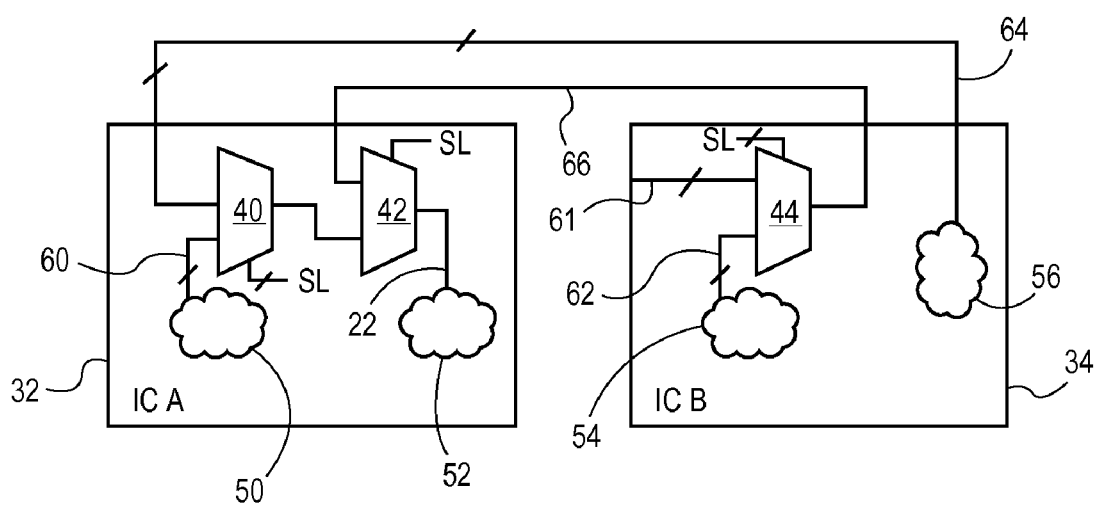
FIG. 1B shows an example of an arrangement of a set of multiplexers which resulted from the partitioning of a single multiplexer into several multiplexers.
Figure 1C:
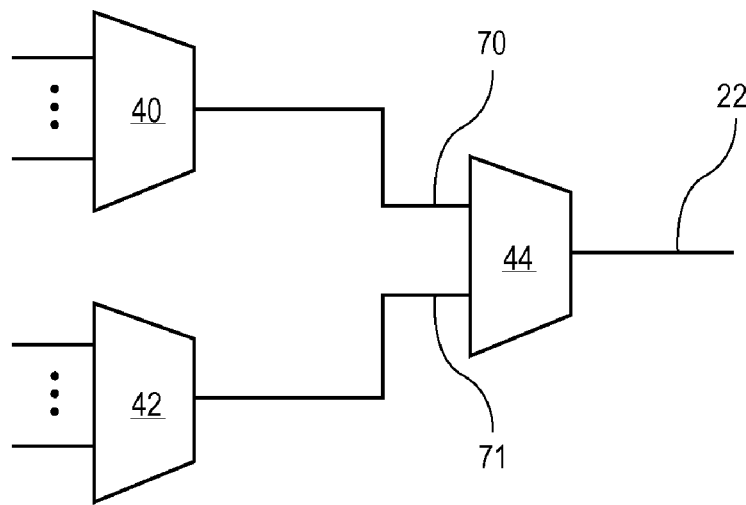
FIG. 1C shows another example of a set of multiplexers which resulted from the partitioning of one multiplexer into several multiplexers.

With this partition neutral design, an automated design system does not need to worry about matching inputs with a particular portion of the multiplexer. The decode logic must, as with the prior art, continue to take into account the input for which it is decoding, but this is no different than the prior art. This partition neutral representation, such as the form shown in FIG. 2B, can be decomposed into a plurality of multiplexers dispersed among different integrated circuits or even different portions of the same integrated circuits as shown in FIG. 2C. It can be seen that the output of these dispersed multiplexers are coupled together at a common output which matches the output of the original multiplexer without any intervening multiplexer between the partitioned multiplexers and the common output. In other words, there is no tree of multiplexers with intervening multiplexers between the outputs from the first level of multiplexers to the final output from the tree of multiplexers. This can also be seen by comparing the set of multiplexers shown in FIG. 1C which resembles a tree to the set of multiplexers shown in FIG. 2C which will now be described.

FIG. 2C shows an example of partitioning the partition neutral representation of a multiplexer shown in FIG. 2B between two integrated circuits 251 and 253. The tristate drivers 217 and 215 have been placed, along with their corresponding decode logic, on the integrated circuit 251 and are driven by logic 261 on the integrated circuit 251. At the same time, tristate drivers 213 and 211, along with their corresponding decode logic, have been placed on integrated circuit 253 along with the logic 263 which provides the inputs for the tristate drivers 213 and 211. The outputs of all four of these tristate drivers are coupled together outside of the two integrated circuits on a wire on a printed circuit board (or other substrate) which couples these two integrated circuits to provide the output 203. This output, in turn, may be routed back to one or more of the integrated circuits to drive additional logic, depending on the design. It will be appreciated that, in at least certain embodiments, the tristate drivers which are normally present at the boundary of an integrated circuit, such as the tristate drivers that drive bonding pads on an integrated circuit, may be used to implement a partition neutral representation of the multiplexer. In particular, the tristate drivers at the boundary of the integrated circuit may be used to form the partition neutral representation if sufficient input/output pins on the various integrated circuits are available for such use.

It will be appreciated that there are alternative partition neutral representations which may use wired OR arrays or wired AND arrays to implement a partition neutral representation of a multiplexer.

The multiplexer's decode logic may be extended to include logic feeding the control lines of the multiplexor. This is particularly an advantage when there is a narrower signal cut through the preceding logic than the number of signals directly connected to the control lines of the multiplexer, or when the new cut can be shared with other multiplexers. Each input is then enabled by a Boolean function of this new, potentially narrower or more shared cut. When the partition neutral decomposed form of the multiplexer is created, each piece of the decomposition will connect to the required control signals and carry the Boolean function. In most cases the area overhead of replicating the control or decode logic into multiple partitions is much less important than the obtained savings in interconnect between partitions by reducing the number of control signals that must be transmitted between partitions.

Figure 3:
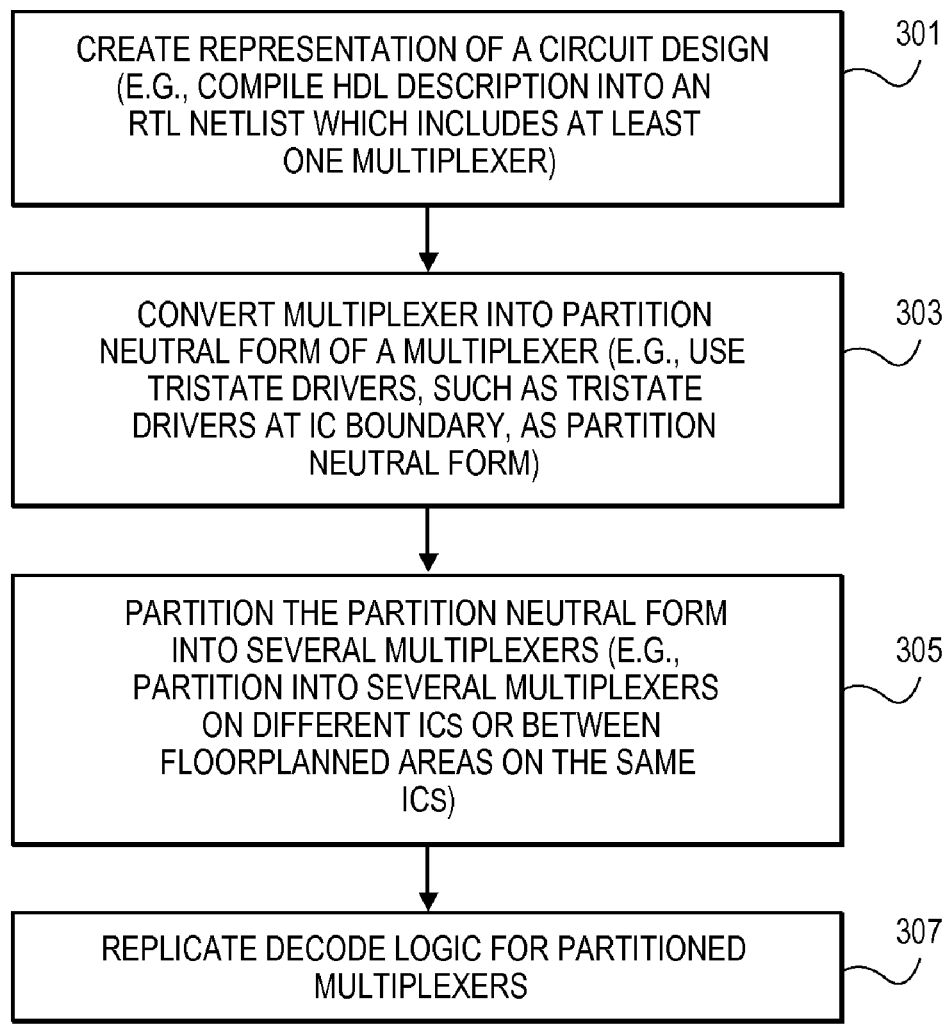
FIG. 3 is a flow chart which illustrates an example of a method according to one embodiment of the present inventions.

FIG. 3 shows an example of a method according to one embodiment of the present inventions. In operation 301, a representation of a circuit design is created. For example, the representation may be created by compiling an HDL description of a circuit design into an RTL netlist which includes at least one multiplexer. In operation 303, the multiplexer may be converted into a partition neutral form of a multiplexer. For example, the multiplexer may be converted from its RTL form into a form which utilizes tristate drivers to create a multiplexer having a partition neutral form. Optionally, the tristate drivers at the boundary of an integrated circuit may be utilized to implement this form. In other embodiments, a wired OR array or a wired AND array may be used to implement a partition neutral form of a multiplexer. In operation 305, the partition neutral form of a multiplexer is partitioned into several multiplexers such that the multiplexers may be placed on different integrated circuits or placed in different portions of the same integrated circuit, such as different floorplanned areas on the same integrated circuit. Then in operation 307, the decode logic may be replicated for the partitioned multiplexers. Following operation 307, placing and routing of the circuitry may be performed, along with other operations such as optimization operations and operations which involve mapping of the RTL into a technology-dependent architecture, such as a target architecture of an integrated circuit, such as a field programmable gate array integrated circuit.

Figure 4:
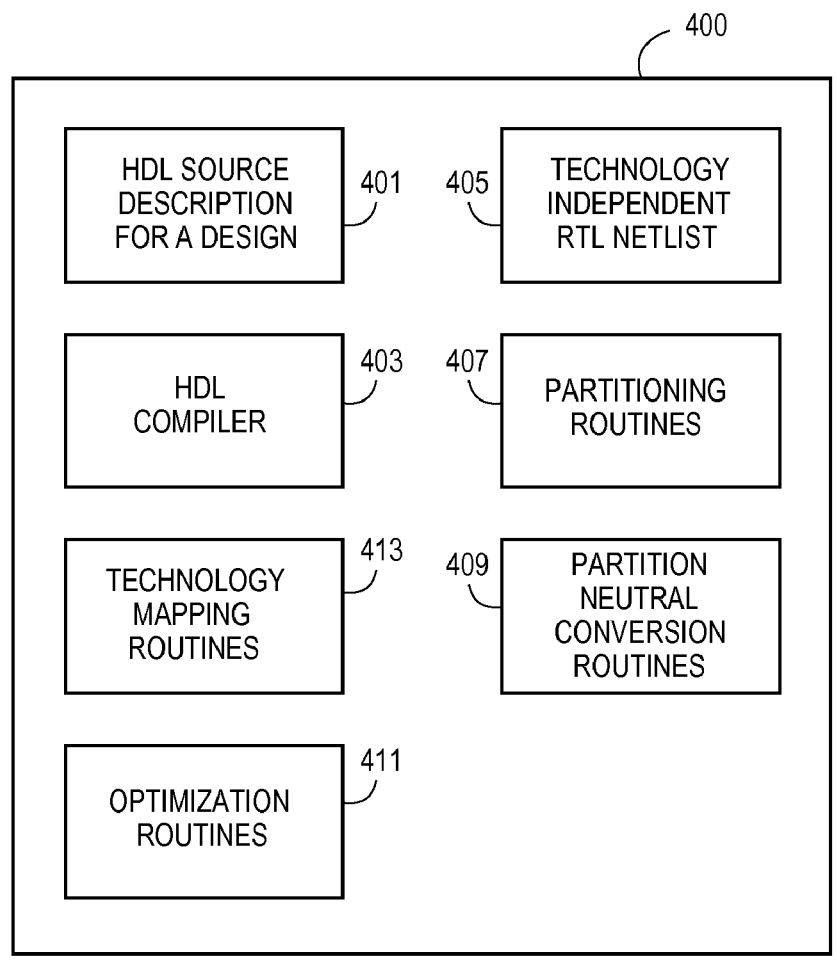
FIG. 4 shows an example of a machine readable medium according to one embodiment of the present inventions.

FIG. 4 shows an example of a machine readable medium or a computer readable medium which may be used to implement one or more methods of the present inventions. For example, the machine readable medium may include executable computer program instructions which when executed by a data processing system, cause the data processing system to perform one or more methods described herein. The machine or computer readable medium may be disposed on a CD-ROM or a DVD-ROM or a magnetic hard disk or other disks or storage devices. The medium may include multiple components and other components not shown in the medium 400 of FIG. 4. In the example shown in FIG. 4, an HDL source description for a design is shown as code 401. An HDL compiler 403 includes executable program instructions which compile the HDL source into, for example, a technology-independent RTL netlist 405. Partitioning routines 407 may be used to partition the technology-independent RTL netlist such that various components of the design are partitioned across multiple integrated circuits. The partitioning routines may include or call upon partition neutral conversion routines 409 which may implement a method such as that shown in FIG. 3 to create a partition neutral form of a multiplexer and then to partition that form into several multiplexers across multiple integrated circuits or across multiple portions of the same integrated circuit, such as multiple floorplanned portions of the same integrated circuit. The medium 400 may further include technology mapping routines 413 which map the partitioned design from the technology-independent RTL netlist which has been partitioned into a technology-dependent netlist which may then be processed further through conventional place and routing tools to create a final netlist or design for a target architecture of the specific integrated circuit vendor, such as the target architecture of an FPGA of Xilinx. The medium 400 may further include optimization routines 411 which may be utilized to optimize the design either after it has been partitioned or before it has been partitioned.

Figure 5:
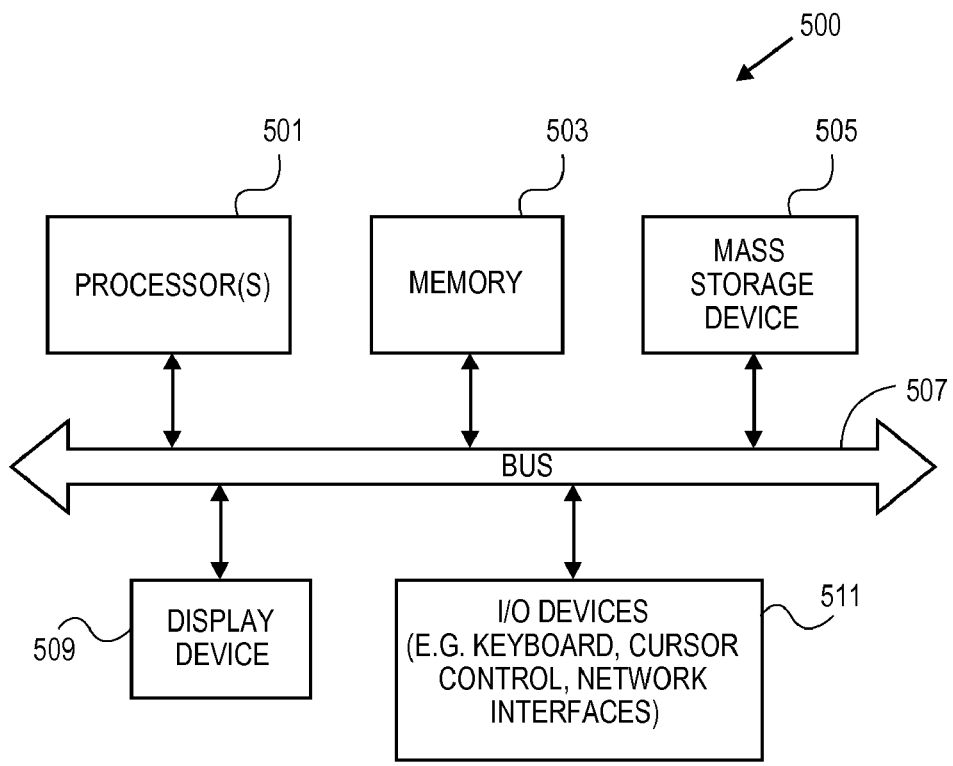
FIG. 5 is a block diagram example of a data processing system that may be used to implement one or more embodiments of the present inventions.

FIG. 5 shows an example of a data processing system which may use the medium 400 in order to perform one or more of the methods described herein. The data processing system 500 includes one or more processors 501 which are coupled to the memory 503 through a bus 507. The processors 501 and the memory 503 are also coupled to the mass storage device 505 which may represent a hard disk or other non-volatile or volatile storage device. In one embodiment, the mass storage device may be a magnetic hard drive which includes the medium 400 shown in FIG. 4. The data processing system also includes a display device 509 and one or more input devices 511, including, for example, a keyboard, a cursor control device, and network interfaces such as an Ethernet interface or a wireless interface. It will be appreciated that the architecture of the data processing device shown in FIG. 5 is provided for purposes of illustration only and that a computer system or other data processing system used in conjunction with the present inventions is not limited to this specific architecture.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A machine readable medium containing executable program instructions which when executed cause a data processing system to perform a method comprising:
receiving a representation of a first multiplexer;
converting the representation of the first multiplexer to a partition neutral representation of the first multiplexer;
partitioning the partition neutral representation of the first multiplexer to create a plurality of second multiplexers.

2. A medium as in claim 1 wherein the plurality of second multiplexers includes a first subset of multiplexers and a second subset of multiplexers, the first subset of multiplexers being designed to be placed on a first integrated circuit (IC) and the second subset of multiplexers being designed to be placed on a second IC, and wherein the first subset includes one or more multiplexers and wherein the second subset includes one or more multiplexers.

3. A medium as in claim 1 wherein the plurality of second multiplexers includes a first subset of multiplexers and a second subset of multiplexers, the first subset of multiplexers being designed to be placed on a first portion of an integrated circuit (IC) and the second subset of multiplexers being designed to be placed on a second portion of the IC, and wherein the first subset includes one or more multiplexers and wherein the second subset includes one or more multiplexers.

4. A medium as in claim 1 wherein the representation of the first multiplexer is in a register transfer level (RTL) form within an RTL netlist and wherein the converting is performed automatically.

5. A medium as in claim 1 wherein the partition neutral representation comprises one of (a) a plurality of tristate drivers; (b) a wired OR array; or (c) a wired AND array.

6. A medium as in claim 1, wherein the method further comprises:
compiling a description of an integrated circuit in a Hardware Description Language (HDL) to create the representation of the first multiplexer.

7. A medium as in claim 6, wherein the method further comprises:
replicating decode logic of the first multiplexer.

8. A medium as in claim 1, the method further comprising:
extending a decode logic of the first multiplexer to include logic driving select lines of the first multiplexer.

9. A medium as in claim 8, wherein the extending occurs before the converting and wherein the extending comprises a signal cut to define control logic to be replicated.

10. A medium as in claim 1, the method further comprising:
converting the partition neutral representation within each partition into RTL (register transfer level) components.

11. A machine implemented method comprising:
receiving a representation of a first multiplexer;
converting the representation of the first multiplexer to a partition neutral representation of the first multiplexer;
partitioning on a data processing system, the partition neutral representation of the first multiplexer to create a plurality of second multiplexers.

12. A method as in claim 11 wherein the plurality of second multiplexers includes a first subset of multiplexers and a second subset of multiplexers, the first subset of multiplexers being designed to be placed on a first integrated circuit (IC) and the second subset of multiplexers being designed to be placed on a second IC, and wherein the first subset includes one or more multiplexers and wherein the second subset includes one or more multiplexers.

13. A method as in claim 11 wherein the plurality of second multiplexers includes a first subset of multiplexers and a second subset of multiplexers, the first subset of multiplexers being designed to be placed on a first portion of an integrated circuit (IC) and the second subset of multiplexers being designed to be placed on a second portion of the IC, and wherein the first subset includes one or more multiplexers and wherein the second subset includes one or more multiplexers.

14. A method as in claim 11 wherein the representation of the first multiplexer is in a register transfer level (RTL) form within an RTL netlist and wherein the converting is performed automatically.

15. A method as in claim 11 wherein the partition neutral representation comprises one of (a) a plurality of tristate drivers; (b) a wired OR array; or (c) a wired AND array.

16. A method as in claim 11, wherein the method further comprises:
compiling a description of an integrated circuit in a Hardware Description Language (HDL) to create the representation of the first multiplexer.

17. A method as in claim 16, wherein the method further comprises:
replicating decode logic of the first multiplexer.

18. A method as in claim 11 further comprising:
extending a decode logic of the first multiplexer to include logic driving select lines of the first multiplexer.

19. A method as in claim 18 wherein the extending occurs before the converting and wherein the extending comprises a signal cut to define control logic to be replicated.

20. A method as in claim 11 further comprising:
converting the partition neutral representation within each partition into RTL (register transfer level) components.

21. A machine comprising:
means for receiving a representation of a first multiplexer;
means for converting the representation of the first multiplexer to a partition neutral representation of the first multiplexer;
means for partitioning the partition neutral representation of the first multiplexer to create a plurality of second multiplexers.

22. A machine readable medium containing executable program instructions which when executed cause a data processing system to perform a method comprising:
receiving a representation of a first multiplexer having an output;
decomposing the representation of the first multiplexer into a plurality of representations of second multiplexers wherein the second multiplexers are coupled together at a common output, which matches the output of the first multiplexer, without any intervening multiplexer between the second multiplexers and the common output;
partitioning the second multiplexers between portions of at least one integrated circuit.

23. A medium as in claim 22 wherein the plurality of representations of second multiplexers is a partition neutral form of the first multiplexer.

24. A medium as in claim 22 wherein the second multiplexers include a first subset of multiplexers and a second subset of multiplexers, the first subset of multiplexers being partitioned to be placed on a first integrated circuit (IC) and the second subset of multiplexers being partitioned to be placed on a second IC, and wherein the first subset includes one or more multiplexers and wherein the second subset includes one or more multiplexers.

25. A medium as in claim 22 wherein the second multiplexers include a first subset of multiplexers and a second subset of multiplexers, the first subset of multiplexers being partitioned to be placed on a first portion of an integrated circuit (IC) and the second subset of multiplexers being partitioned to be placed on a second portion of the IC, and wherein the first subset includes one or more multiplexers and the second subset includes one or more multiplexers.

26. A medium as in claim 22 wherein the representation of the first multiplexer is in a register transfer level (RTL) form within an RTL netlist, and wherein the decomposing is performed automatically.

27. A medium as in claim 22 wherein the plurality of representations of second multiplexers are in the form of one of (a) a plurality of tristate drivers; (b) a wired OR array or (c) a wired AND array.

28. A medium as in claim 22, wherein the method further comprises:

compiling a description of an integrated circuit in a Hardware Description Language (HDL) to create the representation of the first multiplexer.

29. A medium as in claim 28, wherein the method further comprises:
replicating decode logic of the first multiplexer.

30. A machine implemented method comprising:
receiving a representation of a first multiplexer having an output;
decomposing the representation of the first multiplexer into a plurality of representations of second multiplexers wherein the second multiplexers are coupled together at a common output, which matches the output of the first multiplexer, without any intervening multiplexer between the second multiplexers and the common output;
partitioning on a data processing system, the second multiplexers between portions of at least one integrated circuit.

31. A method as in claim 30 wherein the plurality of representations of second multiplexers is a partition neutral form of the first multiplexer.

32. A method as in claim 30 wherein the second multiplexers include a first subset of multiplexers and a second subset of multiplexers, the first subset of multiplexers being partitioned to be placed on a first integrated circuit (IC) and the second subset of multiplexers being partitioned to be placed on a second IC, and wherein the first subset includes one or more multiplexers and wherein the second subset includes one or more multiplexers.

33. A method as in claim 30 wherein the second multiplexers include a first subset of multiplexers and a second subset of multiplexers, the first subset of multiplexers being partitioned to be placed on a first portion of an integrated circuit (IC) and the second subset of multiplexers being partitioned to be placed on a second portion of the IC, and wherein the first subset includes one or more multiplexers and the second subset includes one or more multiplexers.

34. A method as in claim 30 wherein the representation of the first multiplexer is in a register transfer level (RTL) form within an RTL netlist, and wherein the decomposing is performed automatically.

35. A method as in claim 30 wherein the plurality of representations of second multiplexers are in the form of one of (a) a plurality of tristate drivers; (b) a wired OR array or (c) a wired AND array.

36. A method as in claim 30, wherein the method further comprises:
compiling a description of an integrated circuit in a Hardware Description Language (HDL) to create the representation of the first multiplexer.

37. A method as in claim 36, wherein the method further comprises:
replicating decode logic of the first multiplexer.

38. A machine comprising:
means for receiving a representation of a first multiplexer having an output;
means for decomposing the representation of the first multiplexer into a plurality of representations of second multiplexers wherein the second multiplexers are coupled together at a common output, which matches the output of the first multiplexer, without any intervening multiplexer between the second multiplexers and the common output;
means for partitioning the second multiplexers between portions of at least one integrated circuit.

39. A machine readable medium containing executable program instructions which when executed cause a data processing system to perform a method comprising:
receiving a representation of a first logic component which is decomposable into a partition neutral decomposition;
converting the representation of the first logic component to a partition neutral representation;
partitioning the partition neutral representation to create a plurality of logic components which together provide a result of the first logic component.

40. A medium as in claim 39 wherein the first logic component is an N-input adder.

41. A medium as in claim 40 wherein the converting represents the N-input adder as a bus having a set of wires.

* * * * *